US011557481B2

(12) United States Patent
Gotoh

(10) Patent No.: US 11,557,481 B2
(45) Date of Patent: Jan. 17, 2023

(54) CONTACT TO SILICON CARBIDE SEMICONDUCTOR DEVICE

(71) Applicant: FUJI ELECTRIC CO., LTD., Kawasaki (JP)

(72) Inventor: Masahide Gotoh, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 216 days.

(21) Appl. No.: 16/710,668

(22) Filed: Dec. 11, 2019

(65) Prior Publication Data
US 2020/0118821 A1 Apr. 16, 2020

Related U.S. Application Data

(62) Division of application No. 15/414,688, filed on Jan. 25, 2017, now abandoned.

(30) Foreign Application Priority Data

Mar. 16, 2016 (JP) ................. 2016-053117

(51) Int. Cl.
H01L 21/04 (2006.01)
H01L 29/66 (2006.01)
(Continued)

(52) U.S. Cl.
CPC ...... H01L 21/0485 (2013.01); H01L 29/1608 (2013.01); H01L 29/45 (2013.01);
(Continued)

(58) Field of Classification Search
CPC . H01L 21/0485; H01L 29/1608; H01L 29/45; H01L 29/7802; H01I 21/823814; H01I 29/665; C01B 33/06; C23C 16/42
See application file for complete search history.

(56) References Cited

U.S. PATENT DOCUMENTS 5,925,225 A 7/1999 Ngan et al.
6,110,813 A * 8/2000 Ota ..................... H01L 21/0485
257/E21.062
(Continued)

FOREIGN PATENT DOCUMENTS

JP H11-26401 A 1/1999
JP 3888330 B2 2/2007
(Continued)

OTHER PUBLICATIONS

Japan Patent Office, Office Action, Patent Application No. 2016-053117, dated Oct. 29, 2019.
(Continued)

Primary Examiner — Matthew C Landau
Assistant Examiner — Mark Hatzilambrou
(74) Attorney, Agent, or Firm — Rabin & Berdo, P.C.

(57) ABSTRACT

In a silicon carbide semiconductor device in which a contact electrode is formed on a single-crystal silicon carbide semiconductor substrate, a barrier metal (titanium nitride layer) covers an interlayer insulating film in a region other than a contact hole, and a contact electrode of a predetermined electrode material is formed only in a region on the silicon carbide semiconductor substrate in the contact hole opened in the interlayer insulating film on the silicon carbide semiconductor substrate. A top of the barrier metal is covered by a metal electrode (wiring layer) and no nickel metal aggregates are present between the barrier metal and the metal electrode.

6 Claims, 3 Drawing Sheets

(51) Int. Cl.
H01L 29/16 (2006.01)
H01L 29/45 (2006.01)
H01L 29/78 (2006.01)
H01L 29/08 (2006.01)
H01L 29/10 (2006.01)

(52) U.S. Cl.
CPC .... *H01L 29/66068* (2013.01); *H01L 29/7802* (2013.01); *H01L 29/0878* (2013.01); *H01L 29/1095* (2013.01)

(56) References Cited

U.S. PATENT DOCUMENTS

| | | |
|---|---|---|
| 2002/0089027 A1 | 7/2002 | Xu et al. |
| 2002/0125123 A1 | 9/2002 | Ngan et al. |
| 2004/0214453 A1 | 10/2004 | Endou et al. |
| 2006/0273323 A1* | 12/2006 | Yamamoto .......... H01L 21/0485 257/77 |
| 2007/0155157 A1 | 7/2007 | Chou et al. |
| 2010/0171409 A1* | 7/2010 | Ando ...................... B82Y 10/00 428/428 |
| 2012/0037922 A1 | 2/2012 | Kono et al. |
| 2012/0132912 A1 | 5/2012 | Suekawa et al. |
| 2014/0346531 A1* | 11/2014 | Imai ....................... H01L 29/872 257/77 |
| 2015/0194313 A1 | 7/2015 | Ryo et al. |
| 2016/0189969 A1 | 6/2016 | Iguchi et al. |
| 2016/0336224 A1 | 11/2016 | Sugahara et al. |

FOREIGN PATENT DOCUMENTS

| | | |
|---|---|---|
| JP | 2012-094555 A | 5/2012 |
| JP | 2013219150 A | 10/2013 |
| WO | 2015/137420 A1 | 9/2015 |
| WO | 2015/159436 A1 | 10/2015 |

OTHER PUBLICATIONS

Manabu Saji et al., "Interface physical properties of metal—SiC and its junction characteristics", Papers of Technical Meeting on Electronic Materials, IEE Japan, vol. EFM-90-20, pp. 31-38, Sep. 7, 1990.

Satoshi Tanimoto, "Ohmic Contact Fabrication Technology for SiC Power Devices", The Journal of The Surface Finishing Society of Japan, vol. 55, No. 1, pp. 29-32, 2004.

* cited by examiner

CONTACT TO SILICON CARBIDE SEMICONDUCTOR DEVICE

CROSS REFERENCE TO RELATED APPLICATIONS

This application is a division of copending U.S. application Ser. No. 15/414,688, filed on Jan. 25, 2017. Furthermore, these applications claim the benefit of priority of Japanese Patent Application No. 2016-053117, filed on Mar. 16, 2016. The entire disclosures of these prior U.S. and Japanese applications are incorporated herein by reference.

BACKGROUND OF THE INVENTION

1. Field of the Invention

Embodiments of the invention relate to a single-crystal silicon carbide semiconductor device and particularly relate to high-voltage vertical silicon carbide semiconductor device and a method of manufacturing a silicon carbide semiconductor device.

2. Description of the Related Art

Single-crystal silicon carbide has significantly higher breakdown electric field strength and a wider bandgap than single-crystal silicon and realization of lower loss devices, or ultra-high breakdown voltage semiconductor switching devices exceeding a breakdown voltage of 10 kV individually are expected.

In the manufacturing process of a silicon carbide semiconductor device, when a contact (ohmic) electrode is formed on a front side of a wafer, the simplest method is to deposit a metal thin film and perform thermal annealing in an inert gas such as argon at about 1000 degrees C. Currently, nickel-based metals are typically used as a material for the metal (for example, refer to Saji, et al, "Interface physical properties of metal—SiC and its junction characteristics", Papers of Technical Meeting on Electronic Materials, IEE Japan, EFM-90-20, 1990).

During thermal annealing, in a region in a contact hole in an interlayer insulating film, silicon carbide and nickel are in direct contact with each other whereby, the silicon included in the silicon carbide and the nickel react to form nickel silicide, becoming a low resistance contact electrode.

Although the film thickness of the nickel is also dependent on the concentration of the dopant included in the base silicon carbide and the conditions of the thermal annealing, in general, a film thickness of about 50 to 100 nm is sufficient. However, when nickel is deposited to have a thickness within such a range, a low density state, i.e., a state in which "voids are formed" tends to occur easily. In this case, even when attempts are made to form a contact electrode pattern only in the contact hole, with wet etching, the side-etching amount of the nickel layer reaches several times the film thickness and control of the finished dimension is difficult. Further, with dry etching, the etching itself is extremely difficult.

To avoid such characteristics of nickel, as a means to form the contact electrode pattern with good controllability only in the contact hole, a self-aligned process is effective. As a simple method, a resist pattern used for contact hole formation is often reused as a mask when depositing the nickel, i.e., a liftoff process (for example, refer to Tanimoto, Satoshi, "Ohmic Contact Fabrication Technology for SiC Power Devices", The journal of the Surface Finishing Society of Japan, Vol. 55, No. 1, p. 29 (2004)).

Meanwhile, when high process stability in mass production is demanded, a method is used in which after the contact hole is formed and nickel is deposited on the entire front side of the substrate followed by thermal annealing, sufficient nickel on the interlayer insulating film is removed by chemical solution and the outermost surface of the interlayer insulating film is again thinly etched (for example, refer to Japanese Patent No. 3888330).

SUMMARY OF THE INVENTION

A silicon carbide semiconductor device according to one aspect of the present invention includes a single-crystal silicon carbide semiconductor substrate, an interlayer insulating film formed on the silicon carbide semiconductor substrate, the interlayer insulating film having a contact hole, a barrier metal layer formed on the interlayer insulating film outside of the contact hole and on a side surface of the contact hole, a contact electrode disposed on a bottom surface of the contact hole, and a wiring layer covered over the barrier metal layer, a boundary between the barrier metal layer and the wiring layer being free of aggregates of nickel metal.

In the silicon carbide semiconductor device, the contact electrode is made of nickel silicide.

In the silicon carbide semiconductor device, the barrier metal is made of a nitride containing one or more of titanium, zirconium, tantalum, and tungsten.

In the silicon carbide semiconductor device, the barrier metal has a surface roughness of 50 nm or less, said surface roughness being a surface roughness on a microscopic scale that excludes an effect of differences in levels on a macroscopic scale originating in a surface structure of a gate electrode.

According to another aspect of the present invention, method of manufacturing a silicon carbide semiconductor device in which a contact electrode is formed on a single-crystal silicon carbide semiconductor substrate, the method includes forming a contact hole in an interlayer insulating film formed on the silicon carbide semiconductor substrate, forming a barrier metal layer on the interlayer insulating film outside of the contact hole and on a side surface of the contact hole, forming an electrode layer of an electrode material on the barrier metal layer and a bottom portion of the contact hole, thermal annealing the silicon carbide semiconductor substrate thereafter to form a contact electrode made of a nickel silicide in the bottom portion of the contact hole and scatter nickel metal aggregates in a region other than the bottom portion of the contact hole, and immersing the silicon carbide semiconductor substrate thereafter in a chemical solution in which nickel is soluble to dissolve and remove the nickel metal aggregates.

In the method of manufacturing a silicon carbide semiconductor device, the chemical solution includes any of nitric acid, hydrochloric acid, and sulfuric acid.

Objects, features, and advantages of the present invention are specifically set forth in or will become apparent from the following detailed description of the invention when read in conjunction with the accompanying drawings.

DETAILED DESCRIPTION OF THE INVENTION

An embodiment of the present invention will be described in detail with reference to the accompanying drawings. Herein, pure nickel is used as the material of the contact electrode and titanium nitride is used as the material of the barrier metal.

FIGS. 1, 2, 3, 4, and 5 are cross-sectional views of manufacturing processes of a silicon carbide semiconductor device according to the embodiment. FIGS. 1 to 5 show schematic diagrams of a surface structure formed on the n-type silicon carbide substrate 1, as viewed from a cross-sectional direction at each manufacturing process. Further, steps 1 to step 5 correspond to the numbers of FIGS. 1 to 5, respectively.

<Step 1>

Figure 1:
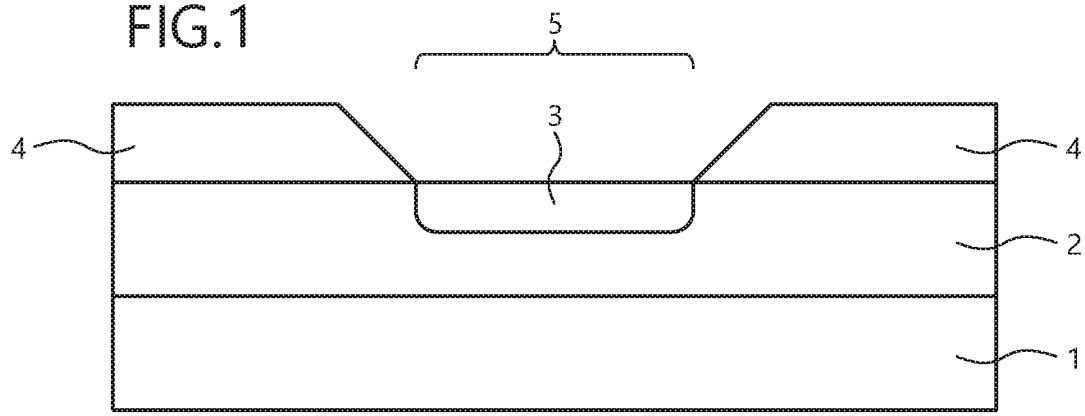
FIGS. 1, 2, 3, 4, and 5 are cross-sectional views of manufacturing processes of a silicon carbide semiconductor device according to an embodiment.

FIG. 1 depicts a state in which a device structure is formed on the n-type silicon carbide substrate 1 and a contact hole 5 is formed directly on a high-concentration ion implantation region. As depicted in FIG. 1, on the single crystal n-type silicon carbide substrate 1 cleaned by a method such as chemical solution cleaning, plasma etching, etc., after an n-type drift layer 2 and a high-concentration ion implantation region 3 are sequentially formed and sealed by an interlayer insulating film 4, the contact hole 5 is opened directly on the high-concentration ion implantation region 3. Techniques of pattern formation, mask alignment, etc. are obvious and description and depiction thereof will be omitted.

<Step 2>

Figure 2:
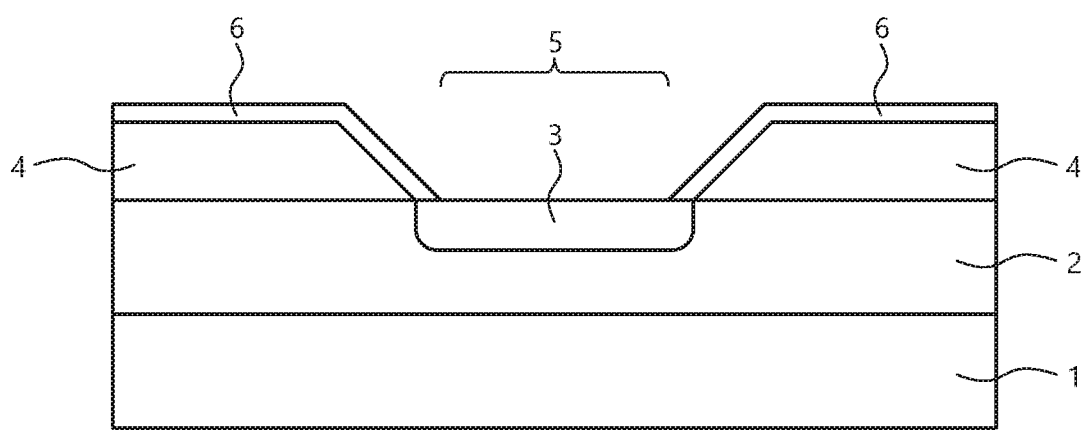

FIG. 2 depicts a state in which a titanium nitride layer 6 is formed on regions other than the contact hole 5, including side walls of the contact hole 5. As depicted in FIG. 2, a region (including the surface of the interlayer insulating film 4) farther outward than the contact hole 5 and including the side walls of the contact hole 5 are protected by the titanium nitride layer 6 suitable as a barrier metal. The region in the contact hole 5 is opened by a technique such as dry etching and the high-concentration ion implantation region 3 is exposed. Similar to step 1, description and depiction of techniques of pattern formation, mask alignment, etc. are omitted herein. As the barrier metal, other than titanium, a nitride that includes one or more of zirconium, tantalum, and tungsten is assumed.

<Step 3>

Figure 3:
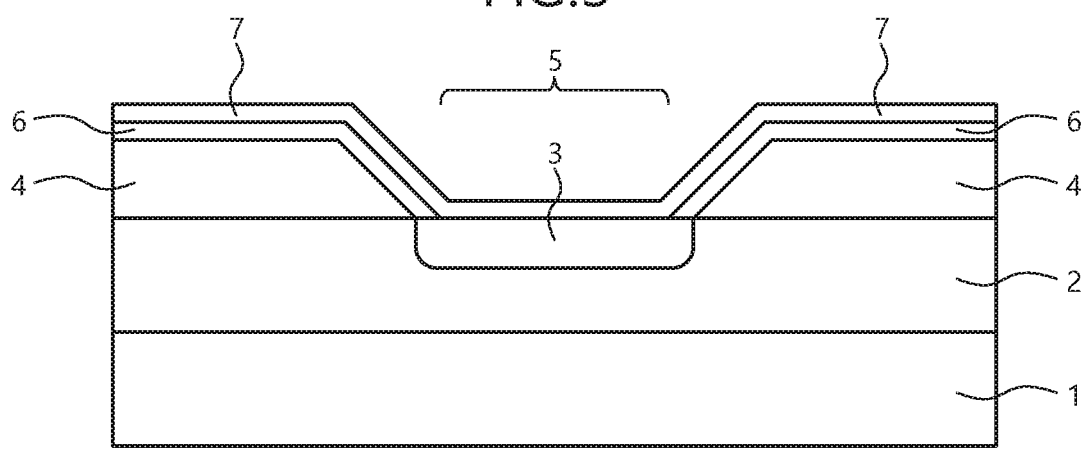

FIG. 3 depicts a state in which a nickel layer 7 is deposited on the entire region of the surface structure. As depicted in FIG. 3, the nickel layer 7 is deposited on the entire region of the surface structure, including the surfaces of the contact hole 5 and the titanium nitride layer 6. As a technique of depositing the nickel layer 7, vapor deposition, sputtering, etc. may be used; in particular, sputtering is excellent for film thickness uniformity and is therefore, suitable. As the nickel layer 7, without limitation to pure nickel, for example, with an aim at suppressing the generation of free carbon, a nickel alloy mixed with about 15 to 30 at % titanium may be used.

Although not depicted, in the case of a vertical-type semiconductor element, since a contact electrode is also required on the substrate rear surface side, similar to the front surface side, a metal such as nickel is also deposited on the rear surface side of the n-type silicon carbide substrate 1 at this stage.

<Step 4>

The n-type silicon carbide substrate 1 having the surface structure formed up to step 3 is placed in an annealing furnace and thermal annealing is performed in an inert gas atmosphere such as argon, nitrogen, etc. Consequent to this annealing, inside the contact hole 5, the nickel layer 7 and the silicon included in the silicon carbide react, forming a nickel silicide layer (contact electrode) 8.

Meanwhile, outside the contact hole 5, since the nickel layer 7 is separated from the interlayer insulating film 4 by the titanium nitride layer 6, a silicide is not formed. However, even when thermal annealing is performed at about 1000 degrees C., which is less than the actual melting point (1455 degrees C.) of nickel, fluidization of the nickel occurs directly on the titanium nitride layer 6 and the state changes to one in which nickel-containing metal aggregates 9 are scattered about.

Figure 4:
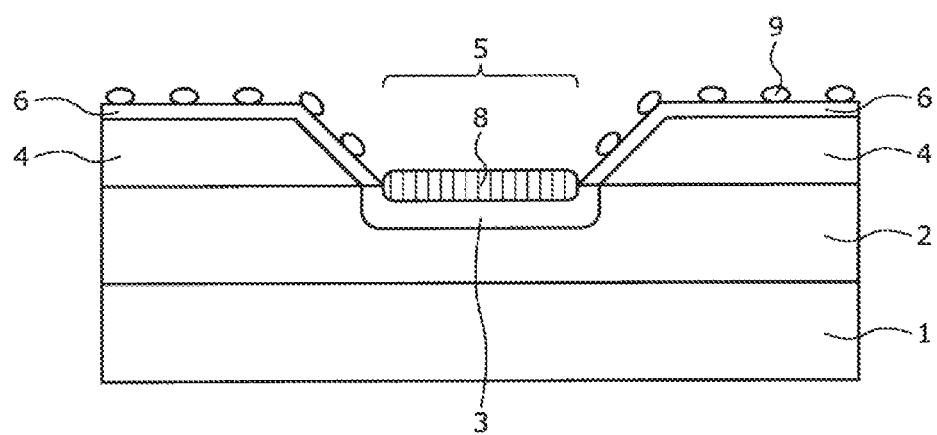

FIG. 4 depicts a state in which thermal annealing is performed whereby the nickel silicide layer 8 is formed inside the contact hole 5, and the nickel-containing metal aggregates 9 are scattered in regions other than the contact hole 5. As depicted in FIG. 4, although the size of the nickel-containing metal aggregates 9 varies to some extent depending on thermal annealing conditions, the presence of differences in levels on a macroscopic scale of the surface structure, etc., the nickel-containing metal aggregates 9 have a granular shape having a long axis of about 200 to 600 nm and a thickness of about 50 to 100 nm. Further, intervals between aggregates are substantially the same as the long axes of the aggregates themselves.

<Step 5>

Next, after the thermal annealing, the n-type silicon carbide substrate 1 is immersed in a chemical solution including one of nitric acid, hydrochloric acid, and sulfuric acid. Provided that the chemical solution is capable of dissolving nickel, no limitation is particularly provided other than the components above. However, from the perspective of common-use of the processing tank, a solution of phosphoric acid/nitric acid or phosphoric acid/nitric acid/acetic acid used in Al—Si alloy patterning is suitable.

Figure 5:
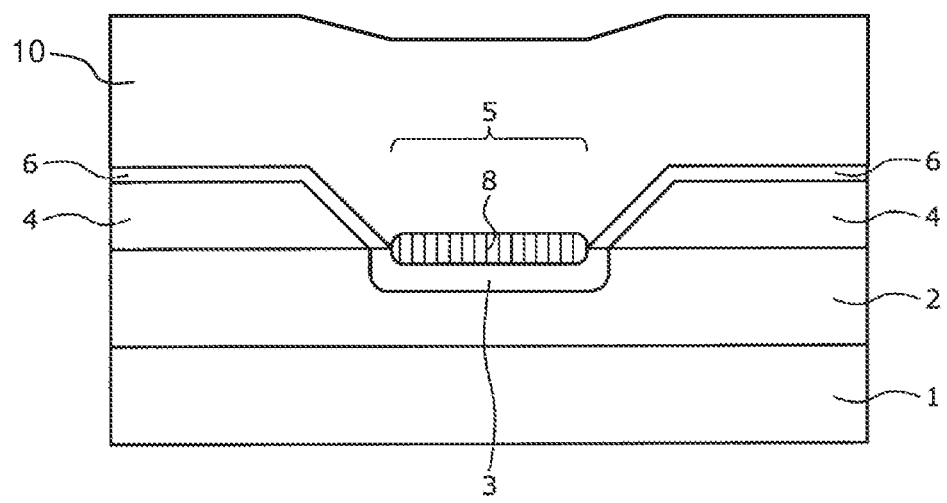

FIG. 5 depicts a state directly after wet etching is performed using a chemical solution including one of nitric acid, hydrochloric acid, and sulfuric acid and only nickel-containing metal aggregates are removed. As depicted in FIG. 5, by processing of immersing the n-type silicon carbide substrate 1 in a chemical, the nickel silicide layer 8 substantially does not react; however, the nickel-containing metal aggregates 9 existing directly on the titanium nitride layer 6 are promptly dissolved and removed. As a result, the flatness on a microscopic scale of the surface structure may be restored to the same level directly after the titanium nitride layer 6 is deposited at step 2.

In a conventional contact electrode formation process, 1) a technique of removing residual nickel and the outermost layer of the interlayer insulating film, after thermal annealing, or 2) a technique of concurrent use of a barrier metal such as titanium nitride is taken. Nonetheless, with the technique of 1), the interlayer insulating film 4 cannot be made thin; and in the technique of 2), the nickel-containing metal aggregates 9 are scattered on the barrier metal (the titanium nitride layer 6) in large numbers. In either case, when an Al—Si alloy is deposited as a wiring layer (metal electrode), a problem arises in that abnormal crystal grain growth and/or the generation of voids may occur.

On the contrary, in the contact electrode formation by the present embodiment described above, a self-aligned process is realized while suppressing the thickness of the interlayer insulating film 4 and the removal of the nickel-containing metal aggregates 9 to restore the flatness of the surface structure of the barrier metal becomes possible.

In FIG. 5, the nickel silicide layer 8 is formed on the silicon carbide substrate (the n-type drift layer 2) only in the contact hole 5. The top of the interlayer insulating film 4 is covered by a metal electrode 10 of an Al—Si alloy or the like, via the titanium nitride layer 6. Furthermore, an electrode formed by nickel silicide is provided on the silicon carbide substrate (the n-type drift layer 2) only at a region inside the contact hole 5. In regions other than the contact hole 5, including the side walls of the contact hole 5, the interlayer insulating film 4 is covered by a barrier metal (the titanium nitride layer 6), a top of the barrier metal is covered by a metal electrode, and the nickel-containing metal aggregates 9 are not present between the barrier metal and the metal electrode. That is, a boundary between the barrier metal layer (titanium nitride layer 6) and the wiring layer 10 is free of aggregates of nickel metal.

From the state depicted in FIG. 5 and thereafter, various element structures may be configured on the silicon carbide substrate 1 and in the silicon carbide semiconductor device having these various element structures, the flatness of the surface structures on the barrier metal may be maintained. As a result, for example, when an Al—Si alloy is deposited on the barrier metal as a wiring layer (metal electrode) 10, the reliability of the semiconductor element may be improved without the occurrence of abnormal crystal grain growth or the generation of voids.

Figure 6:
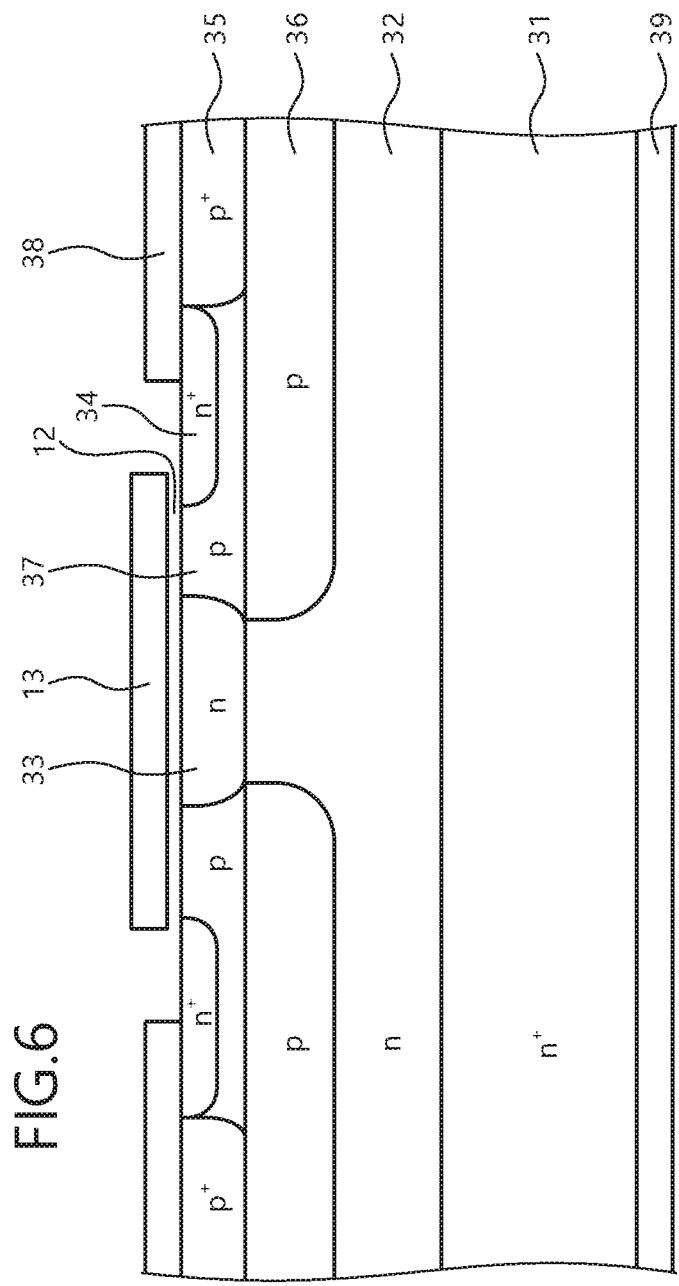
FIG. 6 is a cross-sectional view depicting an example of a semiconductor device having a planar MOS gate structure as an example of application of the present invention.

FIG. 6 is a cross-sectional view depicting an example of a semiconductor device having a planar MOS gate structure as an example of application of the present invention. The example depicted in FIG. 6 is a vertical-type MOSFET in which an n-type epitaxial layer 32 is formed on a front surface of an $n^+$-type silicon carbide substrate 31. An impurity concentration of the n-type epitaxial layer 32 is lower than that of the $n^+$-type silicon carbide substrate 31. In the n-type epitaxial layer 32, plural p-type regions 36 are selectively formed. The p-type regions 36 are exposed on an opposite side of the n-type epitaxial layer 32 with respect to an $n^+$-type silicon carbide substrate 31 side thereof.

Across the surfaces of the p-type regions 36 and the n-type epitaxial layer 32, a p-type SiC layer 37 having a lower concentration than the p-type regions 36 is formed. In the p-type SiC layer 37 on the n-type epitaxial layer 32 where the p-type regions 36 are not formed, an n-type region 33 is formed that passes through the p-type SiC layer 37 in a depth direction and reaches the n-type epitaxial layer 32. The n-type epitaxial layer 32 and the n-type region 33 are an n-type drift region. An impurity concentration of the n-type region 33 may be preferably higher than the n-type epitaxial layer 32.

In the p-type SiC layer 37, an $n^+$-type source region 34 and a $p^+$-type contact region 35 are formed so as to contact each other. The $n^+$-type source region 34 and the $p^+$-type contact region 35 are exposed on an opposite side of the p-type SiC layer 37 with respect to a p-type region 36 side thereof. The $n^+$-type source region 34 is formed away from the n-type region 33. The $p^+$-type contact region 35 is positioned on an opposite side of the $n^+$-type source region 34 with respect to an n-type region 33 side thereof. An impurity concentration of the $p^+$-type contact region 35 is higher than that of the p-type SiC layer 37.

Portions of the p-type SiC layer 37 excluding the $n^+$-type source region 34, the $p^+$-type contact region 35, and the n-type region 33 form p-type base regions together with the p-type regions 36. On the surfaces of the $n^+$-type source region 34 and the $p^+$-type contact region 35, a source electrode 38 is formed. A gate electrode 13 is formed on the surfaces of the p-type SiC layer 37 and the n-type region 33 between adjacent $n^+$-type source regions 34, via a gate insulating film 12. The gate electrode 13 is electrically insulated from the source electrode 38 by a non-depicted interlayer insulating film. Further, on a rear surface of the $n^+$-type silicon carbide substrate 31, a drain electrode 39 contacting the $n^+$-type silicon carbide substrate 31 is formed.

In the semiconductor device having the planar MOS gate structure depicted in FIG. 6, a contact hole is formed in the source electrode 38 portion formed of Ni, etc. contacting the $n^+$-type source region 34 and the $p^+$-type contact region 35, and the interlayer insulating film is provided on a side portion of the source electrode 38. Further, in regions other than the contact hole, including the side walls of the contact hole, an interlayer insulating film is covered by a barrier metal (the titanium nitride layer 6), a top of the barrier metal is covered by a metal electrode, and the nickel-containing metal aggregates 9 are not present between the barrier metal and the metal electrode.

In addition to vertical-type MOSFET element structures, the present invention is similarly applicable to various types of semiconductor devices such as horizontal-type MOSFETs and the like.

According to the embodiment, after an ohmic junction is formed on a silicon carbide substrate by thermal annealing, the silicon carbide substrate is immersed in a chemical solution of phosphoric acid/nitric acid/acetic acid or the like, and nickel-containing metal aggregates remaining on the barrier metal are removed. Here, the nickel-containing metal aggregates alone may be removed, without the nickel silicide formed inside the contact hole dissolving in the chemical solution above. As a result, with the contact electrode remaining as is, the flatness of the surface structure may be restored.

However, when the interlayer insulating film is thin, the reaction amount with nickel is no longer negligible and in the worst case, an abnormality (spike phenomenon) occurs where the nickel penetrates through to the silicon carbide region. Therefore, when suppressing the thickness of the interlayer insulating film to a constant value or less is difficult and unevenness of a gate electrode, etc. is present in an element structure, a tendency for differences in levels on a macroscopic scale (roughly, a height of 300 nm more) of the interlayer insulating film to become accentuated is unavoidable. When an Al—Si alloy or the like is deposited as a wiring layer, such a difference in levels brings about abnormal crystal grain growth and the generation of voids, related to decreased reliability of the semiconductor element.

On the contrary, in preventing the spike phenomenon above while suppressing the thickness of the interlayer insulating film, concurrent use of a barrier metal such as titanium nitride and the like is effective. Concerning this point, the inventor actually tried to produce an element structure and even when the annealing temperature was less than the actual melting point (1455 degrees C.) of nickel, nickel-containing metal that could not react with the silicon carbide in the contact hole became fluidized directly on the barrier metal.

When the fluidization of the nickel-containing metal is scattered across the entire region on the barrier metal, countless grain-shaped aggregates having a long axis of about 200 to 600 nm and a thickness of about 50 to 100 nm are generated and the flatness of the surface structure degrades. Further, a new problem was confirmed in that when an Al—Si alloy or the like is deposited as a wiring layer, abnormal crystal grain growth and/or the generation of voids is brought about and reliability of the semiconductor element decreases.

This problem is thought to be caused by the nickel placed in a high-temperature environment taking in titanium included in the barrier metal whereby melting-point depression occurs. Further, when the nickel-containing metal aggregates are scattered across the entire region on the barrier metal, in addition to the differences in levels on a macroscopic scale, the flatness of on a microscopic scale (roughly, a height of about 100 nm or less) degrades and when an Al—Si alloy or the like is deposited, abnormal crystal grain growth and/or the generation of voids results.

According to the present invention, after an ohmic junction is formed by thermal annealing on a silicon carbide substrate, the silicon carbide substrate is immersed in a chemical solution of phosphoric acid/nitric acid/acetic acid, and nickel-containing metal aggregates remaining on the barrier metal are removed. Here, the nickel-containing metal aggregates alone may be removed, without the nickel silicide formed inside the contact hole dissolving in the chemical solution above. As a result, with the contact electrode remaining as is, the flatness of the surface structure may be restored.

According to the present invention, no fine aggregates of nickel are present on the barrier metal and the flatness of the barrier metal may be improved.

As described, the silicon carbide semiconductor device and the method of manufacturing a silicon carbide semiconductor device according to the present invention are useful for silicon carbide semiconductor devices that use silicon carbide as a semiconductor material.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a silicon carbide semiconductor device in which a contact electrode is formed on a single-crystal silicon carbide semiconductor substrate, the method comprising:

forming a contact hole in an interlayer insulating film formed on the silicon carbide semiconductor substrate;

forming a barrier metal layer on the interlayer insulating film outside of the contact hole and on a side surface of the contact hole;

forming an electrode layer of an electrode material that is a nickel alloy containing titanium in a range of 15 at % to 30 at %, on the entirety of an upper surface of the barrier metal layer and on a bottom portion of the contact hole, so as to make the electrode layer directly contact the silicon carbide semiconductor substrate;

thermal annealing the silicon carbide semiconductor substrate with the electrode layer formed on the barrier metal layer under an inert gas atmosphere at a temperature that is at least 1000 degrees C. and less than 1455 degrees C., thereafter to form a contact electrode made of a nickel silicide in the bottom portion of the contact hole and scatter nickel metal aggregates, each of which has a length along a long axis in a range of 200 nm to 600 nm and a thickness in a range of 50 nm to 100 nm, in a region other than the bottom portion of the contact hole; and immersing the silicon carbide semiconductor substrate thereafter in a chemical solution in which nickel is soluble to dissolve and remove the nickel metal aggregates.

2. The method of manufacturing a silicon carbide semiconductor device according to claim 1, wherein the chemical solution includes any of nitric acid, hydrochloric acid, and sulfuric acid.

3. The method of manufacturing a silicon carbide semiconductor device according to claim 1, wherein the barrier metal layer is comprised of a nitride containing one or more of titanium, zirconium, tantalum, and tungsten.

4. The method of manufacturing a silicon carbide semiconductor device according to claim 1, further comprising forming an Al—Si alloy on the barrier metal layer as a wiring layer.

5. The method of manufacturing a silicon carbide semiconductor device according to claim 1, further comprising forming a back side electrode layer of the electrode material on a back side of the silicon carbide semiconductor substrate when the electrode layer is formed.

6. The method of manufacturing a silicon carbide semiconductor device according to claim 1, further comprising forming a metal electrode on the barrier metal layer after the nickel metal aggregates are dissolved and removed.

* * * * *